(12) United States Patent  
Nishio

(10) Patent No.: US 7,665,783 B2  
(45) Date of Patent: Feb. 23, 2010

(54) VACUUM SUCTION HEAD, AND VACUUM SUCTION DEVICE AND TABLE USING THE SAME

(75) Inventor: Yoshitaka Nishio, Suita (JP)

(73) Assignee: Mitsuboshi Diamond Industrial, Co., Ltd., Osaka (JP)

( * ) Notice: Subject to any disclaimer, the term of this patent is extended or adjusted under 35 U.S.C. 154(b) by 416 days.

(21) Appl. No.: 10/595,901

(22) PCT Filed: Nov. 19, 2004

(86) PCT No.: PCT/JP2004/017255

§ 371 (c)(1),  
(2), (4) Date: Dec. 29, 2006

(87) PCT Pub. No.: WO2005/049287

PCT Pub. Date: Jun. 2, 2005

(65) Prior Publication Data

US 2007/0200377 A1     Aug. 30, 2007

(30) Foreign Application Priority Data

Nov. 21, 2003   (JP)   .............................. 2003-392157

(51) Int. Cl.  
  *B25J 15/06*   (2006.01)
(52) U.S. Cl. ........................................ 294/64.1; 294/65
(58) Field of Classification Search ................ 294/64.1, 294/64.3, 65; 414/627, 737; 269/21  
See application file for complete search history.

(56) References Cited

U.S. PATENT DOCUMENTS

| | | | | |
|---|---|---|---|---|
| 4,600,228 A | * | 7/1986 | Tarbuck ..................... | 294/64.1 |
| 4,763,941 A | * | 8/1988 | Sniderman ................. | 294/64.1 |
| 4,846,517 A | * | 7/1989 | Boke et al. ................. | 294/65 |
| 5,029,383 A | * | 7/1991 | Snyder et al. .............. | 29/740 |
| 5,172,922 A | * | 12/1992 | Kowaleski et al. ......... | 279/3 |
| 5,688,008 A | * | 11/1997 | Hansch ...................... | 294/64.1 |
| 6,502,808 B1 | * | 1/2003 | Stone et al. ................ | 269/21 |
| 2003/0062735 A1 | * | 4/2003 | Pabst .......................... | 294/64.1 |

FOREIGN PATENT DOCUMENTS

| | | |
|---|---|---|
| EP | 0 472 738 | 3/1992 |
| FR | 2 547 289 | 12/1984 |
| JP | 34-2757 | 4/1959 |
| JP | 49-101974 | 9/1974 |
| JP | 60 085890 | 5/1985 |
| JP | 61 100338 | 5/1986 |
| JP | 01 210240 | 8/1989 |
| JP | 4-13590 | 1/1992 |
| JP | 04 013590 | 1/1992 |
| JP | 06 336392 | 12/1994 |
| JP | 2002 018757 | 1/2002 |
| JP | 2002127070 | 5/2002 |
| JP | 2002307356 | 10/2002 |

* cited by examiner

*Primary Examiner*—Dean J Kramer

(57) ABSTRACT

A vacuum suction head of the present invention can be applied to a large-sized liquid crystal display panel and can reliably suck an object to be sucked even if the object has undulation or flexure. The suction head has a shaft, which holds a suction pad, and gas is charged into and discharged from the suction pad through a suction hole. A casing holds the shaft through first and second springs so as to be movable in the axial direction. Since the suction pad is elastically supported by the springs, the suction pad can reliably suck the object to be sucked having undulation or flexure. The vacuum suction head can be used for a vacuum suction device and a working table.

9 Claims, 14 Drawing Sheets

-- PRIOR ART --

-- PRIOR ART --

-- PRIOR ART --

FIG. 4 --PRIOR ART--

F I G. 5
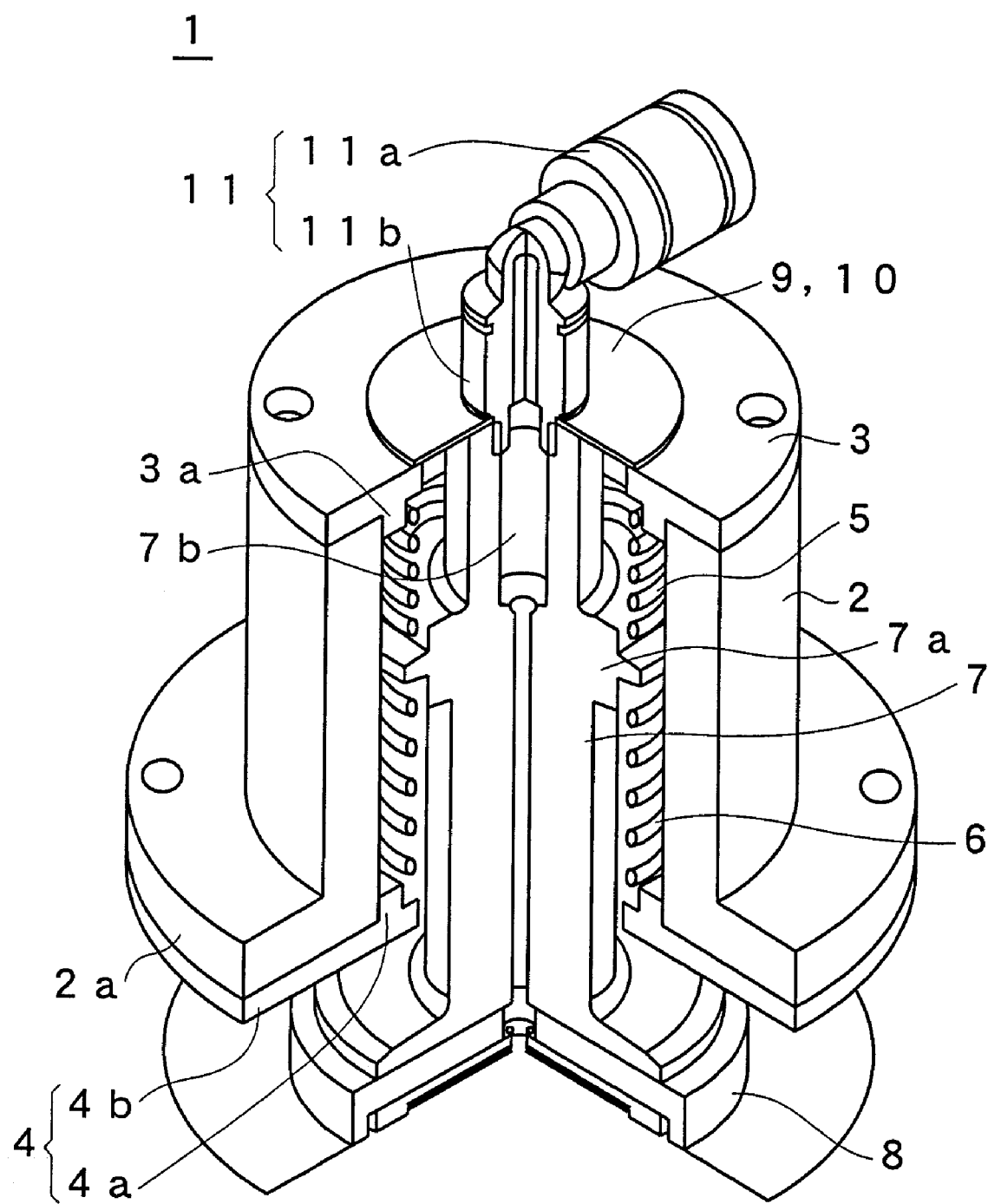

VACUUM SUCTION HEAD, AND VACUUM SUCTION DEVICE AND TABLE USING THE SAME

TECHNICAL FIELD

The present invention relates to a vacuum suction head used in sucking and conveying an object to be sucked such as a glass plate, liquid crystal display panel substrate, plate-shaped molded article made of resin, thin plate made of metal; and a vacuum suction device and a table for sucking the object to be sucked by one or a plurality of vacuum suction heads.

BACKGROUND ART

A liquid crystal display panel is a panel composed of two glass substrates, whose peripheral edges adhered using an adhesive (sealing agent) while maintaining a gap by particulate spacers between two glass substrates, and liquid crystal is injected into the gap. The liquid crystal display panel used in each display device differs greatly in a display size according to the application. In particular, a liquid crystal display panel for television receiver or monitor is becoming larger year after year, and accompanied therewith, a glass substrate used in the liquid crystal display panel is becoming larger and thinner year after year.

A plurality of the liquid crystal display panel substrates are simultaneously manufactured by dividing a large-sized mother liquid crystal display panel substrate. In such a process that the liquid crystal display panel substrate is manufactured by cutting the large-sized mother liquid crystal display panel substrate, a vacuum suction device is used to suck and convey the liquid crystal display panel substrate between steps of the process. The vacuum suction device provides one or a plurality of suction pads. The liquid crystal display panel substrate is formed by laminating two glass substrates of approximately 0.5 mm to 0.7 mm thin plate. Such liquid crystal display panel substrate bends easily. Thus, each location of the liquid crystal display panel substrate must be sucked and conveyed using a plurality of suction pads when conveying, in particular, the large-sized liquid crystal display panel substrate.

A conventional vacuum suction head will now be explained. The liquid crystal display panel substrate is explained as an example of the object to be sucked in following explanation. FIG. 1 shows a configuration view of a suction pad of conventional example 1 disclosed in patent document 1. The suction pad 51 is configured with a rubber suction disk 51a of semispherical shape, and a suction tube 51b coupled to an upper part of the suction disk 51a. The suction pad 51 is widely used to suck an object to be sucked such as not only the liquid crystal display panel substrate but a plate-shaped molded article made of resin, thin plate made of metal and the like. However, when a liquid crystal display panel substrate is sucked by the suction pad 51 of conventional example 1, a glass surface curves, uneven distribution occurs in a spacer interposed between the glass substrates, there has been a possible that product defect of the liquid crystal display panel substrate occurs as a result of uneven distribution, caused by curvature of glass surfaces, of spacers interposed between the glass substrates.

FIG. 2 is a cross-section view showing a configuration of a suction pad 61 disclosed in the patent document 1. The suction pad 61 is dealt with as conventional example 2. A suction disk 62 is a disk-shaped suction disk made of photosensitive resin material, and a suction port 62c penetrating through in the up and down direction is formed at its central part. A great number of convex parts are arranged on a sucking surface side of the suction disk 62, and a flat surface having the same height as the convex parts is provided at an outer peripheral edge to maintain air tightness. The convex parts are formed by performing photo etching process for the photosensitive resin material (AFP). A reinforcement layer 63 is a layer laminated to prevent the AFP from deforming by external stress. A magnet sheet 64 is a sheet having the same diameter as the suction disk 62. A double-faced adhesive sheet 65 is an adhesive sheet for bonding the magnet sheet 64 and the reinforcement layer 63. Each of these members 63 to 65 provides a hole Q at a position corresponding to the suction port 62c. A holding member 66 10 made of iron is a holding member made of iron having the same outer diameter as the magnet sheet 64. A supporting member 66a for supporting the holding member itself is arranged at the central part of the holding member 66. A suction tube 67 is inserted into the supporting member 66a. The suction tube 67 is connected to a vacuum pump which is not shown.

The suction disk 62 formed in such manner pushes against a flat liquid crystal display panel substrate and performs vacuuming through the suction port 62c. In this manner, the suction pad 61 can made the liquid crystal display panel substrate sucked to the suction disk 62 without deforming. Since the suction disk 62 is composed of a flexible material, a high suction performance is achieved even if the liquid crystal display panel substrate has slight flexure. However, a large flexure is formed at the liquid crystal display panel substrate by the weight of the substrate when conveying the large-sized liquid crystal display panel substrate using the suction pad 51 of conventional example 1 or the suction pad 61 of conventional example 2 described above. The arrangement density of the suction pad must be made high with respect to the liquid crystal display panel substrate to prevent the flexure.

A case of moving the large-sized liquid crystal display panel substrate to next step of the process after mounting the liquid crystal display panel substrate on a working table will be considered. A plurality of suction pads are required to be arranged on a conveying machine at a suitable interval corresponding to a shape of a liquid crystal display panel substrate so that the conveying machine sucks and holds a large-sized liquid crystal display panel substrate at suction pads from a working table. In this case, the suction height of each suction pad must be aligned at a predetermined precision. If undulation is present at a surface of the liquid crystal display panel substrate, vertical line directions of sucking surfaces on the liquid crystal display panel substrate differs each other depending on their locations. Thus, if central axis directions of the plurality of suction pads are all fixed in the same direction, the clearance between the suction pad and the liquid crystal display panel substrate may not be a predetermined value, or may form space thereby causing suction failure.

A suction device in which central axis directions of suction pads (hereinafter referred to as suction disk depending on the document) change with respect to a surface of an object to be sucked, that is, whose suction pads can freely oscillate will be explained as conventional example 3. FIG. 3 is a cross-section view showing a configuration of a vacuum suction pad disclosed in patent document 2. The vacuum suction pad has a pad 72 arranged on a periphery of a suction disk 71, and the suction disk 71 and the pad 72 are held in a freely oscillating manner using a supporting rod 74. An air passage hole 75a coupling to a vacuum pump is formed in the supporting rod 74 having a spherical end, and an air passage hole 75b is also formed in the suction disk 71. And then, a space S surrounded by the suction disk 71 and the pad 72 can be discharged from or charged with air through the air passage hole 75b. A spring 79 is contacted to the air passage hole 75a and a spool valve 77 is inserted. A sensor rod 78 extending to an end face of the pad 72 is attached to an end of the spool valve 77. A center part of a supporting body 73 for holding the suction disk 71 is cut out into a spherical shape to hold the spherical part of the supporting rod 74 in a freely oscillating manner.

When the object to be sucked is contacted to the suction device, the sensor rod 78 contacts the surface of the object to be sucked, and then, the spool valve 77 lifts against the reactive force of the spring 79. At this time, the air flow holes 75a and 75b communicate each other, and air is discharged from the space S by a vacuum pump. The space S is thereby held in a vacuum state.

A vacuum suction device arranged with a great number of suction pads is disclosed in patent document 3 (not shown). This discloses that an object to be sucked is a mother liquid crystal display panel substrate. The vacuum suction device sucks in vacuum and conveys the mother liquid crystal display panel substrate mounted on a working table. The vacuum suction device is characterized in arranging a tilt adjuster so that a large number of suction pads can be adjustable to become parallel to a surface of the mother liquid crystal display panel substrate.

FIG. 4 is a cross-section view showing a configuration of a vacuum suction device 80 in conventional example 4 disclosed in patent document 3. An extended strip 81 extends in a moving direction and a vertical direction of a movement table. A cylinder 82 is attached to the extended strip 81. A horizontal supporting plate 83 is arranged below the extended strip 81, and a suction fixing member 84 is attached further below being parallel to the horizontal supporting plate 83. The cylinder 82 moves the horizontal supporting plate 83 up and down with using two shafts 85 as guiding rods. Four shafts 86 penetrate the horizontal supporting plate 83 fixed to the suction fixing member 84. The balance in a horizontal direction of the suction fixing member 84 is adjusted through the intermediately of a spring 87 by adjusting a nut 88. Further, four tilt adjusters 89 are attached to four corners of the suction fixing member 84. A mother liquid crystal display panel substrate 90 is mounted on a working table 91.

According to such configuration, the distance of the suction fixing member 84 with respect to a surface of the working table 91 can be adjusted for every tilt adjuster 89. A tilt of the suction fixing member 84 is adjusted so as to be horizontal. The suction fixing member 84 has a cavity therein. A plurality of suction pads 92 are attached to a lower surface of the suction fixing member 84. A configuration of the suction pads 92 is the same as that in conventional example 2 shown in FIG. 2.

A method of preliminarily fixing the working table 91 and the plurality of suction pads 92 in parallel will be explained next. The suction fixing member 84 is lowered by driving the cylinder 82 toward the surface of the working table 91. The suction pads 92 are set at a position having 1 to 2 mm clearance from the surface of the working table. Thereafter, a level is arranged on an upper surface of the suction fixing member 84, and lower end positions of tilt adjustment bars 89a at the four tilt adjusters 89 are adjusted so that the suction fixing member 84 becomes horizontal. At this time, the lower end positions of the four tilt adjustment bars 89a are detected using a position detector which is not shown, and stored in a first position memory which is not shown.

The mother liquid crystal display panel substrate 90 to be sucked and conveyed is then mounted on the working table 91. The suction fixing member 84 is positioned by the drive of a motor 89b so that the suction pads 92 are at a height most suitable for sucking and fixing the mother liquid crystal display panel substrate 90. The lower end positions of the four tilt adjustment bars 89a at this point are detected using the position detector and stored in a second position memory which is not shown.

According to such setting, the suction pad 92 is automatically positioned with respect to a new mother liquid crystal display panel substrate 90 each time the mother liquid crystal display panel substrate 90 is conveyed. If a thickness of the mother liquid crystal display panel substrate 90 changes, a value of the second position memory changes based on the relevant value.

Patent Document 1: Japanese Unexamined Patent Publication No. 11-19838

Patent Document 2: Japanese Unexamined Utility Model Publication No. 48-45064

Patent Document 3: International Patent Publication WO 03/049909 A1

DISCLOSURE OF INVENTION

Problems to be Solved by the Invention

When conveying a glass substrate, an allowable range of undulation is, for example, preferably set to 2 mm to 20 mm if one side of the glass substrate is 1 m. Further, when a laminated glass substrate is an object to be sucked, a thickness thereof is intended to be approximately 1.0 mm to 1.4 mm. A vacuum suction device for holding and conveying such delicate laminated glass substrate must not make an impact the glass substrate and must respond to undulation at a surface of an object to be sucked. The suction pad as in conventional example 2 cannot respond to undulation at a surface of a large-sized glass substrate since it does not have the oscillating function.

The suction pad of conventional example 3 freely oscillates but is developed for an object to be sucked such as building materials, press steel plate and the like. Thus, the suction pad is not suited to sucking an object to be sucked having a fine configuration such as liquid crystal display panel substrate.

In other words, although the suction pad of conventional example 3 has a freely oscillating function, a tilted state remains when a neck (suction pad) is tilted. When sucking a liquid crystal display panel substrate with the neck (suction pad) in the tilted state, the suction pad cannot adequately follow a sucking surface of the liquid crystal display panel substrate, and the suction pad tends to strongly press the sucking surface. Thus, in the liquid crystal display panel substrate, a gap of micrometer order may change at locations where the liquid crystal display panel substrate is sucked by the suction pad of conventional example 3. If the suction pad sucks the liquid crystal display panel substrate without adequately following the sucking surface, the liquid crystal display panel substrate may be dropped in the middle of conveying.

In the vacuum suction device 80 of conventional example 4, the height of the sucking surface at the plurality of suction pads 92 is required to be preliminarily aligned. Further, in the vacuum suction device 80, the tilt of the suction fixing member 84 for holding each suction pad 92 must be adjusted using the level and the like. Moreover, a mechanism for independently adjusting the height of each suction pad 92 is not provided in the vacuum suction device 80. Thus, undulation or deflection forms at the mother liquid crystal display panel substrate 90 depending on the mounting condition when the mother liquid crystal display panel substrate 90 is mounted on the working table 91. The clearance between the surface of the mother liquid crystal display panel substrate 90 and the sucking surface of the suction pad 92 differs for each suction pad 92, and a difference in suction force is created. When the surface of the mother liquid crystal display panel substrate 90 is pressed too strongly in order to reduce the difference in suction force, the mother liquid crystal display panel substrate 90 may break, or the gap between the two glass substrates of the mother liquid crystal display panel substrate may change.

The present invention, in view of the conventional problems, aims to provide a vacuum suction head that can be applied to an object to be sucked, whether small or large, such as a brittle material substrate of glass plate, semiconductor substrate, ceramics plate and the like, liquid crystal display panel substrate, plate-shaped molded article made of resin, thin plate made of metal and the like, and that reliably sucks an object to be sucked even if undulation or flexure is present at the object to be sucked before suction or during suction. The present invention also aims to provide a vacuum suction head in which the orientation of a suction pad is corrected and directed to a predetermined direction even if the suction pad is tilted after releasing an object to be sucked from a sucking state. The present invention further aims to provide a vacuum suction device that reliably sucks an object to be sucked without performing an accurate height adjustment of suction pads even if one or a large number of suction heads are arranged. The present invention further aims to provide a vacuum suction table that has at least one suction head described above and arranged with a suction disk facing upwards, and that reliably floats an object to be sucked with compressed air and sucks it after positioning.

Means to Solve the Problems

A vacuum suction head is characterized by comprising: a suction pad which contacts and sucks in vacuum a sucking surface of an object to be sucked; a shaft which holds said suction pad at one end, and is provided with an air charging and discharging hole for charging gas into and discharging gas from said suction pad; a casing part which has a cylindrical space for regulating a movable range of said shaft and holding said shaft in a slightly movable manner; and an elastic supporter which elastically supports said shaft in said casing part, in a freely and slightly movable manner in an axial direction of said casing part and in a direction diagonal to the axial direction.

Further, said shaft has a step which is arranged in a guard shape at a substantially intermediate position in said casing part, said casing part comprises a cylindrical part which provides a space for holding said elastic supporter in a freely deforming manner in the inner side, a first casing plate which encloses one end of said cylindrical part remaining a first opening, and a second casing plate which encloses the other end of said cylindrical part remaining a second opening, and said elastic supporter includes a first spring which is held between said first casing plate and said step, and a second spring which is held between said second casing plate and said step.

Further, said first spring and said second spring are coil springs, and an aperture-diameter of said first and second openings is larger than an outer diameter of said shaft and smaller than an outer diameter of said first spring and said second spring.

Further, said suction pad is arranged on said second opening side, and a compression force of said first spring is greater than a compression force of said second spring when said suction pad is in a no-load state.

Further, said suction pad includes a sucking part which uses a plate-shaped member and has a plurality of independent convex parts and concave parts on one surface of the member, an air tight part which is formed into an annular shape at an outer peripheral position of said plate-shaped member surrounding said sucking part, a groove which acts as a passage for discharging gas of said sucking part, and a vacuum suction disk which has with an opening for externally discharging gas in said groove.

Further, said suction pad provides a skirt pad which is formed so as to surround said vacuum suction disk, and shields outside air from surrounding space of said vacuum suction disk when said vacuum suction disk approaches the object to be sucked up to a predetermined position.

Further, said suction pad is composed of a flat resin without asperity.

A vacuum suction device comprises at least one vacuum suction head, and the vacuum suction head contacts and sucks in vacuum the surface of the object to be sucked.

A table according to claim 9 comprises a vacuum suction head with a suction pad facing upward, and the vacuum suction head contacts and sucks in vacuum a sucking surface of the object to be sucked to said suction pad.

Said table further comprises positioning means for positioning said object to be sucked.

EFFECTS OF THE INVENTION

According to the vacuum suction head of the present invention, since a shaft is elastically supported so as to be freely and slightly movable in an axial direction and in a direction diagonal to the axial direction (this mechanism is hereinafter referred to as freely following manner), the suction pad follows the surface of the object to be sucked, and reliably sucks the object to be sucked even if the object to be sucked has undulation. The adhesiveness between the suction pad and the surface of the object to be sucked can be enhanced irrespective of the shape of the object to be sucked. According to the vacuum suction device of the present invention, the plurality of vacuum suction heads can be arranged without performing an accurate height adjustment of the suction pad according to the size of the object to be sucked, and the suction force of each suction head is uniformly maintained. Further, the types of suction pad can be changed according to the surface condition, material, and flexural rigidity of the object to be sucked. A vacuum suction table having a plurality of suction heads arranged with a suction disk facing upwards, reliably floating the object to be sucked with compressed air, and sucking it after positioning can be realized.

BRIEF DESCRIPTION OF DRAWINGS

FIG. 5 is a fracture cross-section view showing a configuration of a vacuum suction head according to an embodiment of the present invention.

EXPLANATION OF NUMERALS

Figure 1:
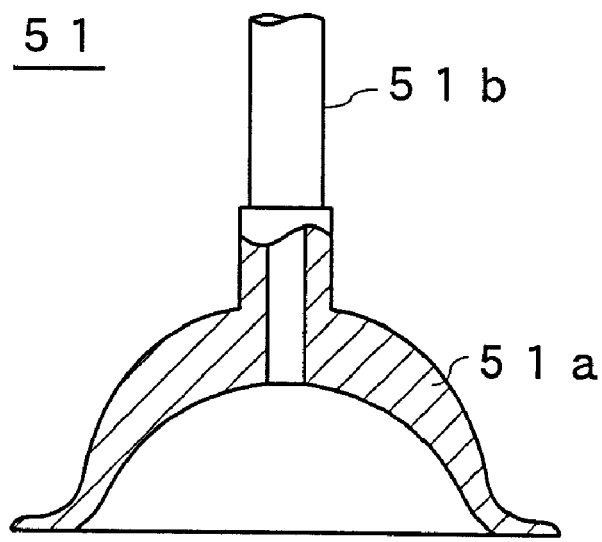
FIG. 1 is a cross-section view showing a configuration of a suction pad of conventional example 1.

1 Vacuum suction head
2 Casing
2*a* Flange
3 First casing plate
3*a*, 4*a* Projection
4 Second casing plate
5 First spring
6 Second spring
7 Shaft
7*a* Step
7*b* Air suction hole
8 Suction pad
9 Lubricant sheet
10 Stopper plate
11 Joint coupler
11*a* Joint coupling
11*b* Nipple
31 Vacuum suction pad
32 Skirt pad
32*a* Plate part
32*b* Annular part
32*c* Skirt part
32*d* Slit
33 Suction disk
33*a* Air tight part
33*b* Sucking part
33*c* Groove
33*d* Opening
34 Reinforcement layer
35*a*, 35*b* Double-faced adhesive sheet
36 Suction port
40 Vacuum suction device
41 Chucking table
42*a*-42*d* Angle

BEST MODE FOR CARRYING OUT THE INVENTION

Figure 6:
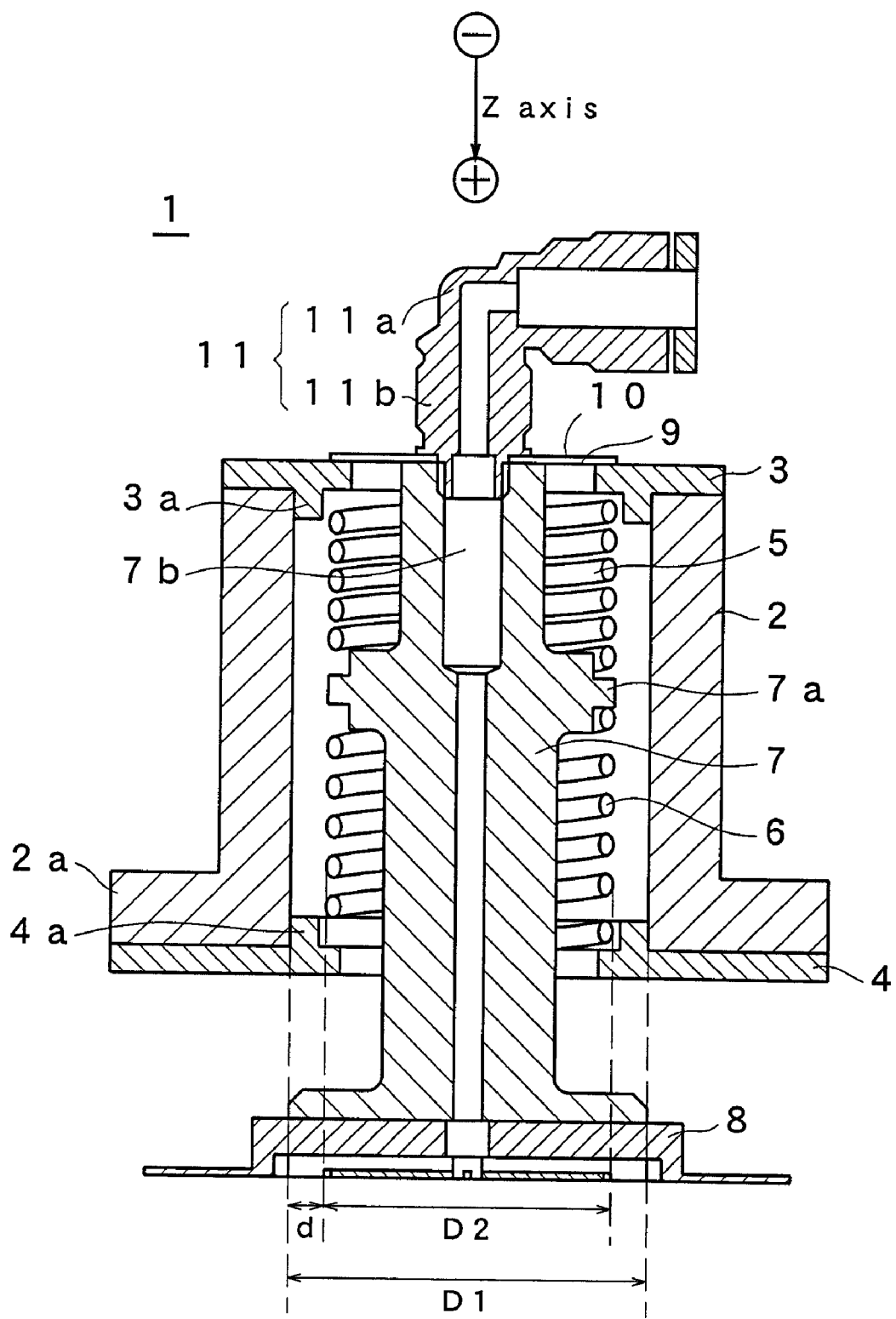
FIG. 6 is a cross-section view showing a configuration of the vacuum suction head according to the embodiment of the present invention.
Figure 7:
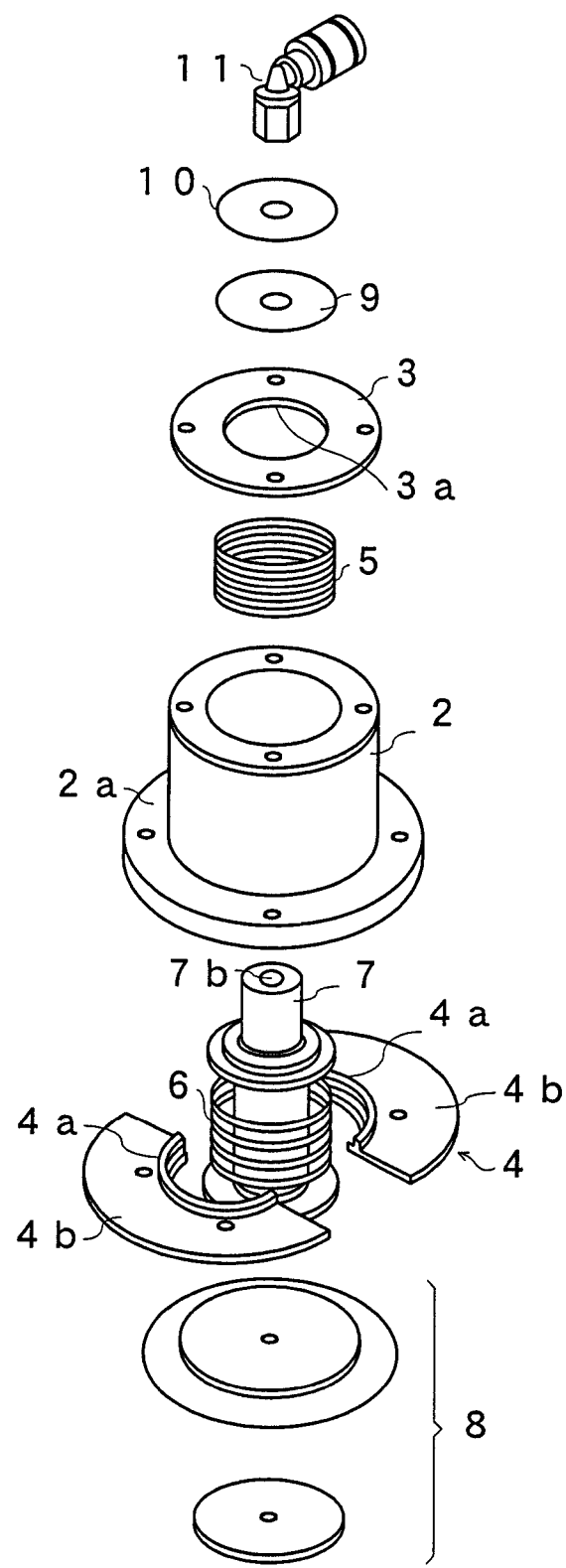
FIG. 7 is an exploded perspective view showing a configuration of the vacuum suction head according to the embodiment of the present invention.

A vacuum suction head and vacuum suction device according to an embodiment of the present invention will now be described with reference to the drawings. FIG. 5 shows a fracture cross-section view showing an inner configuration of a vacuum suction head 1 in the present embodiment. FIG. 6 shows a cross-section view taken along a center axis of the vacuum suction head 1. FIG. 7 shows an exploded perspective view showing an attachment relationship of components of the vacuum suction head 1. The vacuum suction head 1 is configured including a casing part, a sucking part, and an elastic supporter. As shown in FIG. 6, a direction along the center axis of the vacuum suction head 1 is a z-axis direction, where an upward direction is "−" and a downward direction is "+".

The casing part includes a casing 2, a first casing plate 3 formed with a first opening, and a second casing plate 4 having second opening. A first spring 5 and a second spring 6 are arranged in the casing 2 as the elastic supporter. An aperture-diameter of the first and second openings takes a value that holds the first spring 5 and the second spring 6 on an inner side of the casing 2 without letting the springs go outer side of it. The aperture-diameter is greater than an outer diameter of the shaft 7, and smaller than an outer diameter of the first spring 5 and the second spring 6. The casing part holds the sucking part by using the elastic supporter so as to be movable, that is, so as to be freely movable in the z-axis direction and in a diagonal direction slanted from the z-axis direction. The casing part corrects an orientation to have a shaft 7 in a state oriented towards a predetermined direction by the spring forces of the first spring 5 and the second spring 6.

The casing part will now be explained using FIG. 5 to FIG. 7. The casing 2 is a cylindrical member integrally formed with a flange 2*a* at one end, which inner diameter is D1. An outer diameter of the first spring 5 and the second spring 6 is D2, and a clearance for the first spring 5 and the second spring 6 to be freely deformed inside the casing 2 is d. In this case, D1=D2+2d. The flange 2*a* is provided to fix the casing 2 to the second casing plate 4, and has a thickness that allows a fixation screw hole to be formed. The flange 2*a* has a plurality of screw holes and holes formed to attach the vacuum suction head of the present invention to the vacuum suction device.

The first casing plate 3 has a first opening at its center. The first casing plate 3 has a function of fixing an upper part of the first spring 5 when holding the shaft 7 in a freely rising and falling manner by way of the first spring 5 and the second spring 6. An outermost diameter of the first casing plate 3 is the same as an outer diameter of a cylindrical part of the casing 2. The first casing plate 3 is fixed to an upper end face of the casing 2 with screws. An annular projection 3*a* is provided in an inner side of the first casing plate 3. The second casing plate 4 is configured by two semicircular plates 4*b*, as shown in FIG. 7. The second casing plate 4 has a second opening coaxial with the first opening at its center, and provides an annular projection 4*a* at inner circumference. The projection 3*a* regulates the upper end position of the first spring 5 so as to be coaxial with the first casing plate 3. The projection 4*a* regulates the lower end position of the second spring 6 so as to be coaxial with the second casing plate 4. Further, the first opening of the first casing plate 3 and the second opening of the second casing plate 4 restrict a tilt of the shaft 7 by being contacted with the shaft at the inner side.

Next, the sucking part will be explained. The sucking part is configured including the shaft 7, suction pad 8, lubricant sheet 9, stopper plate 10, and joint coupler 11. When the vacuum suction head 1 contacts the object to be sucked with the suction pad 8 held at one end, the shaft 7 charges or discharges air inside the suction pad 8, releases negative pressure in the suction pad 8, and sprays high pressure air. An air suction hole 7*b* is thereby formed at the center axis of the shaft 7. The shaft 7 contacts ends of the first spring 5 and the second spring 6 at both sides of a step 7*a*. The circular lubricant sheet 9 and the stopper plate 10 are attached to the other end face of the shaft 7, as shown in FIG. 7.

The joint coupler 11 may be an elbow type or a straight type. The elbow type is illustrated herein. The joint coupler 11 includes a joint coupling 11*a* and a nipple 11*b*, as shown in FIG. 5. A male screw of the nipple 11*b* is screwed into a female screw arranged at an upper part of the suction hole 7*b* of the shaft 7 to connect the joint coupler 11 to the shaft 7.

The elastic supporter will be explained. The first spring 5 and the second spring 6 serving as the elastic supporter are coil springs having the same outer diameter D2 and inner diameter dimensions. The shaft 7 is made to be a single body, and a rewinding force is applied to deform the second spring 6 and enlarge the inner diameter in order to hold the first spring 5 and the second spring 6 in the state shown in FIG. 5 or FIG. 6. The second spring 6 is inserted from the upper part of the shaft 7 in this state. When the rewinding force is released after the second spring 6 passes through the step 7*a*, the second spring 6 can be held at the regular position. The second casing plate 4 divided in half is screwed fastened to the flange 2*a* of the casing 2 as shown in FIG. 7 in this state. The first spring 5 is held at a regular position by simply being inserted into the upper part of the shaft 7. Compression force (pressurized) is applied to the first spring 5 and the second spring 6, so that the first casing plate 3 is screwed fastened and fixed to the upper end face of the casing 2. And then, the first spring 5 and the second spring 6 are then held in a pressurized state.

The nipple 11*b* is screwed together with the suction hole 7*b* of the shaft 7 to fix the lubricant sheet 9 and the stopper plate 10. When each component is set in such state, the pressurization of the first spring 5 becomes greater than that of the second spring 6. A restoration force then acts against the pressurization of the first spring 5 to have the shaft 7 be closer to the second opening side. In other words, the position in the z-axis direction of the suction pad 8 with respect to the casing 2 is set to a waiting position in a state in which the object to be sucked does not contact the suction pad, a state in which the suction pad does not suck the object to be sucked, and a state (hereinafter referred to as no-load state) in which the suction pad does not float the object to be sucked by air blowing. However, further movement towards the "+" z-axis direction of the shaft 7 is regulated by the stopper plate 10 contacting the upper surface of the first casing plate 3. When the suction pad 8 contacts the object to be sucked on the "−" z-axis side from this position, the shaft 7 moves in the "−" z-axis direction.

In FIG. 5 to FIG. 7, the first casing plate 3, the casing 2, and the second casing plate 4 are configured as separate components. However, the configuration serving as the casing part is not limited to the above configuration as far as the degree of freedom of deformation of the elastic supporter is maintained. For instance, the flange may be provided any at the upper part (one end of the casing), center, or lower part (other end of casing). When positioning the flange at a position different from the position in the embodiment, the second casing plate 4 and the casing 2 are fixed with a screw by forming a fixation screw hole at the portion overlapping the cylindrical part of the casing 2. Further, the first casing plate 3 and the casing 2 may be integrally configured. The number of components, and the number of assembly steps are reduced by integral configuration. In addition, the casing part may have a configuration divided in half by a plane passing through the centers of the first and second openings. The method of assembling the first spring 5 and the second spring 6 is not limited to the above-described method.

When the outer diameter of the suction pad 8 is small, the first spring 5 can be inserted from the upper part of the shaft 7 having the step 7*a* as a boundary and the second spring 6 can be inserted from the lower part of the shaft 7. When the suction pad 8 is configured so as to be removable with respect to the shaft 7 using the screw, the suction pad 8 can be attached to the shaft 7 after inserting the second spring 6 and the second casing plate 4 to the shaft 7. The attachment of the suction pad 8 to the shaft 7 may be completed with an adhesive or brazing in other examples. In this case, the second spring 6 and the second casing plate 4 may be inserted into the shaft 7 before attaching the suction pad 8. The shape of the shaft 7 is also not necessarily limited to that shown in FIG. 5 and FIG. 6. For instance, instead of simultaneously processing the shaft 7 main body having the step 7*a*, an E ring or O ring may be inserted to a pipe configuring the shaft 7, which may hold the lower end of the first spring 5 and the upper end of the second spring 6. The thin plate stopper plate 10 is arranged to regulate the movement in the "+" z-axis direction of the shaft 7, however, the E ring or O ring may be inserted to the relevant portion. Further, although the generalized joint coupling 11*a* and nipple 11*b* are used as the joint coupler 11, connecting components having a different configuration may also be used.

Even if an unreasonable load is applied, the elastic supporter prevents the first spring 5 and the second spring 6 from plastic deformation as a result of overstretching by using the coil spring that contacts the upper and lower parts of the step 7*a*. Since the first spring 5 and the second spring 6 are springs winded in a spiral shape or a circular shape having a center, the shaft 7 is more easily positioned at the center axis position of the casing 2 compared to using a spring of other shape.

The dimensions of the inner diameter and outer diameter of the first spring 5 and second spring 6 are not limited to the same dimension. The spring length or the spring constant of the first spring 5 and the second spring 6 are appropriately changed in accordance with various conditions. The suction pad 8 can thus adjust the force of contacting the object to be sucked and the force of holding the object to be sucked. In the embodiment, the metal coil spring is used for the first spring 5 and the second spring 6, but elastic member made of rubber or resin may also be used.

There are various configurations for the suction pad in accordance with the applications. The suction pad 51 shown in FIG. 1 can be used when sucking a general substrate or a pressed article and the like. When sucking the display panel substrate in which two glass substrates are laminated, it is required that uneven distribution of the spacer between two glass substrates does not occur. In this case, the suction pad 61 shown in FIG. 2 is used. Further, a plurality of such suction pads 61 are used when sucking a large-sized laminated glass substrate at a plurality of locations. In such case, clearance may form between each suction pad and the object to be sucked if there is attachment tolerance in each suction pad, or if each suction head is tilted with respect to the object to be sucked. Thus, when the sucking surface of the suction pad attempts to entirely contact and suck the object to be sucked, areas pressed strongly against the object to be sucked are formed. In the vacuum suction head 1, the object to be sucked is reliably sucked without being broken since the force of pressing the object to be sucked is relieved as the shaft 7 moves backward. Moreover, the height of each suction pad in a no-load state does not need to be aligned since the suction pad itself smoothly moves in up and down direction.

The configuration of the suction pad 8 according to another embodiment of the present invention will be described using FIG. 8. The suction pad 8 is configured including a vacuum suction pad 31 and a skirt pad 32. The vacuum suction pad 31 has a multi-layer configuration in which the suction disk 33 and the reinforcement layer 34 are joined with a double-faced adhesive sheet 35*a*. The suction disk 33 provides an air tight part 33*a* of a flat surface at the peripheral edge, and a sucking part 33*b* having a large number of convex parts.

The suction disk 33 has a disc shape made of photo-sensitive resin material, and provides an opening 33*d* at its central part as one part of a suction port 36 passing through in up and down direction. The air tight part 33*a* is an outer periphery region of the suction disk where the photo-sensitive resin material is not etched. An annular groove 33*c* is formed as a new concave part on the inner peripheral side of the air tight part 33*a*. An opening 33*d* is formed at the center of the suction disk 33. Such groove communicates with the opening 33*d*, and acts as a passage when discharging air present in the concave part. The reinforcement layer 34 is a layer laminated to prevent the photo-sensitive resin material configuring the suction disk 33 from deforming by external stress.

The skirt pad 32 is a rubber molded article in which the plate part 32*a*, annular part 32*b*, and skirt part 32*c* are integrally molded. The plate part 32*a* is a disc-shaped holding member for holding the vacuum suction pad 31 by using the double-faced adhesive sheet 35*b*, the diameter of the plate part is sufficiently larger than the outer diameter of the vacuum suction pad 31. An opening is also formed at the center of the plate part 32*a*, and communicates with the opening of the vacuum suction pad 31 to act as the suction port 36. The annular part 32*b* is formed in a thick annular shape at the outer edge portion of the plate part 32*a* so as to surround the vacuum suction pad 31 with a predetermined clearance. The annular part 32*b* is formed so that the vacuum suction pad 31 projects below the annular part 32*b*. The lower surface of the annular part 32*b* is positioned rather in the "−" z-axis direction than the lower surface of the vacuum suction pad 31. The skirt pad 32*c* is a thin annular-shaped rubber member that spreads in a conical shape in a direction toward the brittle material substrate with the annular part 32*b* as a base.

The skirt pad 32 acts to enlarge the air discharging space at the periphery of the sucking part and to increase the suckable clearance between the vacuum suction pad 31 and the object to be sucked when sucking the object to be sucked. Since the skirt part 32*c* has a thin thickness, when the suction pad 8 approaches the object to be sucked, the outer peripheral part contacts and elastically deforms. Thus, the skirt part 32*c* of the skirt pad 32 exhibits the sealing function for shielding the flow of air from the surrounding by contacting with the object to be sucked.

A slit 32*d* is formed in the annular part 32*b*, and the air leaks between the skirt outer part and the skirt inner part. The slit 32*d* prevents the substrate from locally deforming when sucking the substrate if the object to be sucked is a laminated substrate. The slit 32*d*, for example, is obtained by forming slits at one portion of the outer peripheral part to the molded skirt pad 32. The slit 32*d* only needs to be a pass-through hole of a size that maintains the inner space at a negative pressure until the skirt part 32*c* contacts the object to be sucked and the vacuum suction pad 31 contacts the object to be sucked, and that does not prevent the vacuum suction pad 31 from sucking the object to be sucked.

Figure 8:
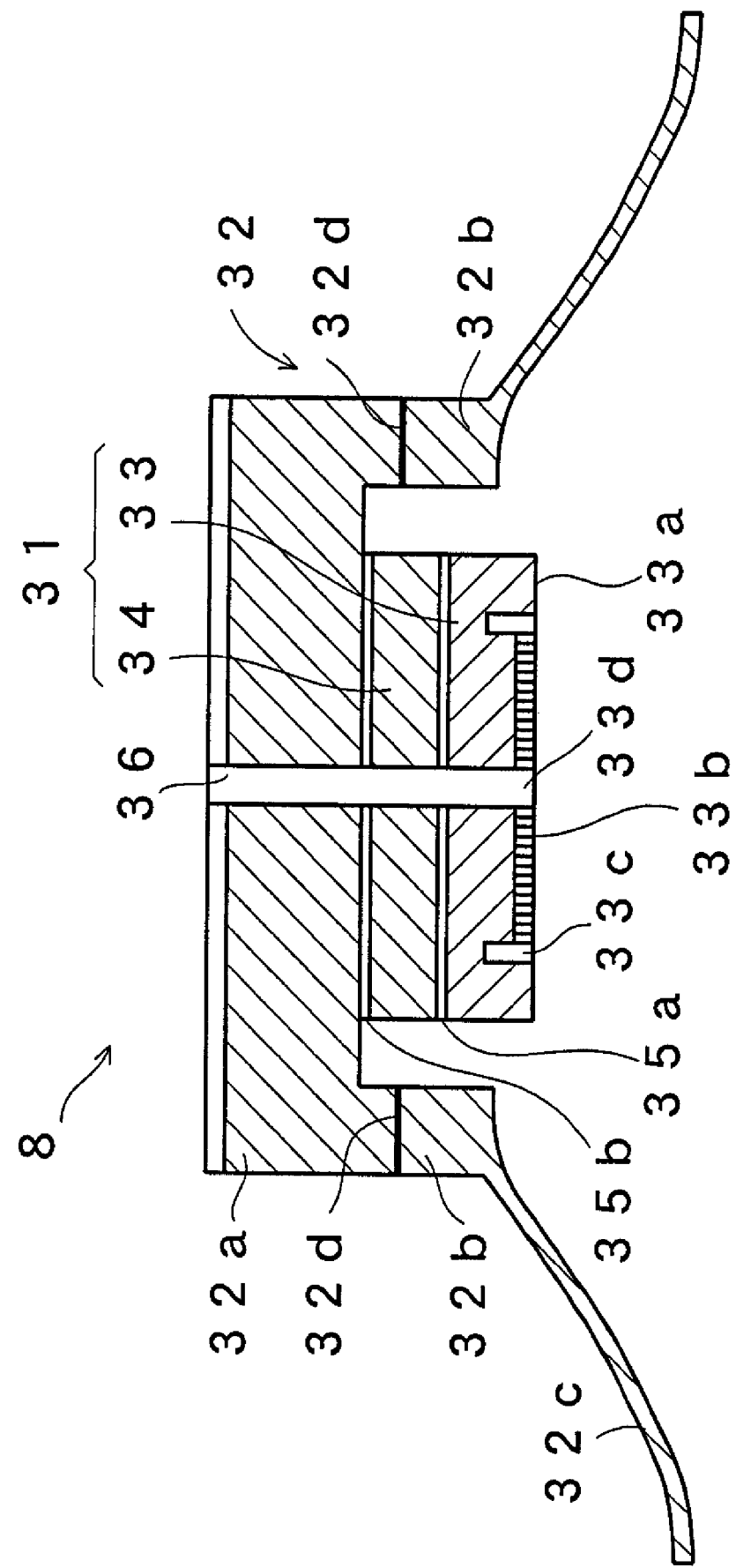
FIG. 8 is a cross-section view showing one example of a suction pad used in the vacuum suction head of the embodiment.

Compared to the suction pad of conventional example 2 shown in FIG. 2, the suction pad 8 shown in FIG. 8 has a larger contacting surface area and more easily follows to the tilt or undulation of the surface at the brittle material substrate of the object to be sucked due to addition of the skirt part. Thus, the vacuum suction head of the present invention more easily tilts following the tilt or the undulation of the surface of the brittle material substrate. The periphery of the suction disk 33 can be stably become to negative pressure at an early stage immediately before sucking the brittle material substrate.

Figure 2:
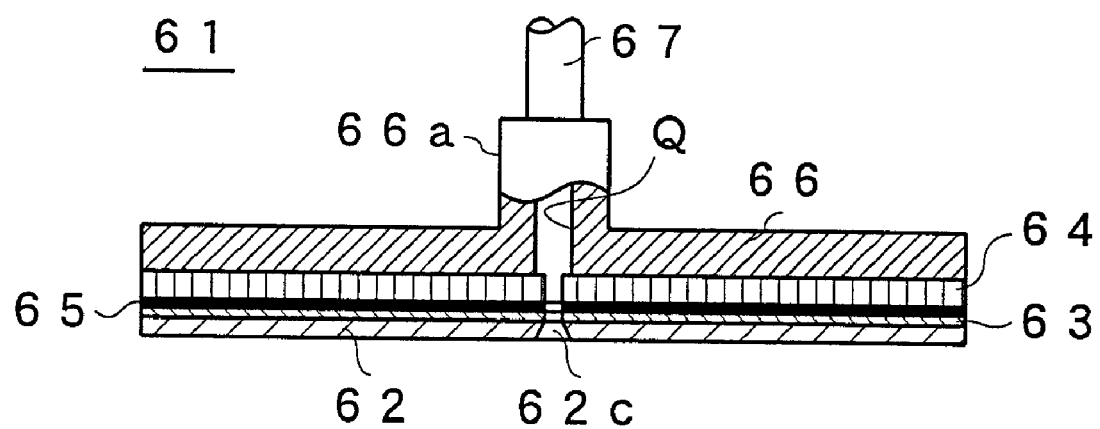
FIG. 2 is a cross-section view showing a configuration of a suction pad of conventional example 2.
Figure 3:
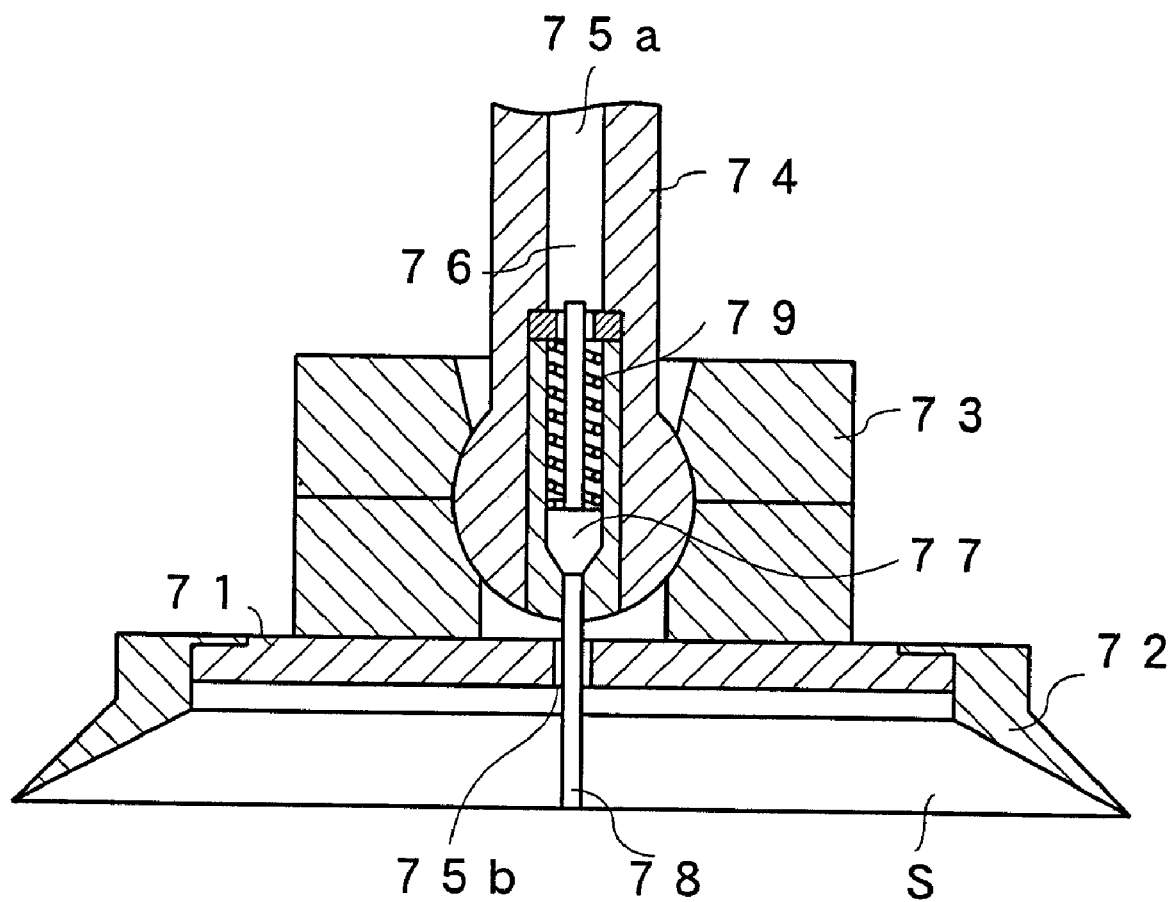
FIG. 3 is a cross-section view showing a configuration of a suction pad of conventional example 3.
Figure 4:
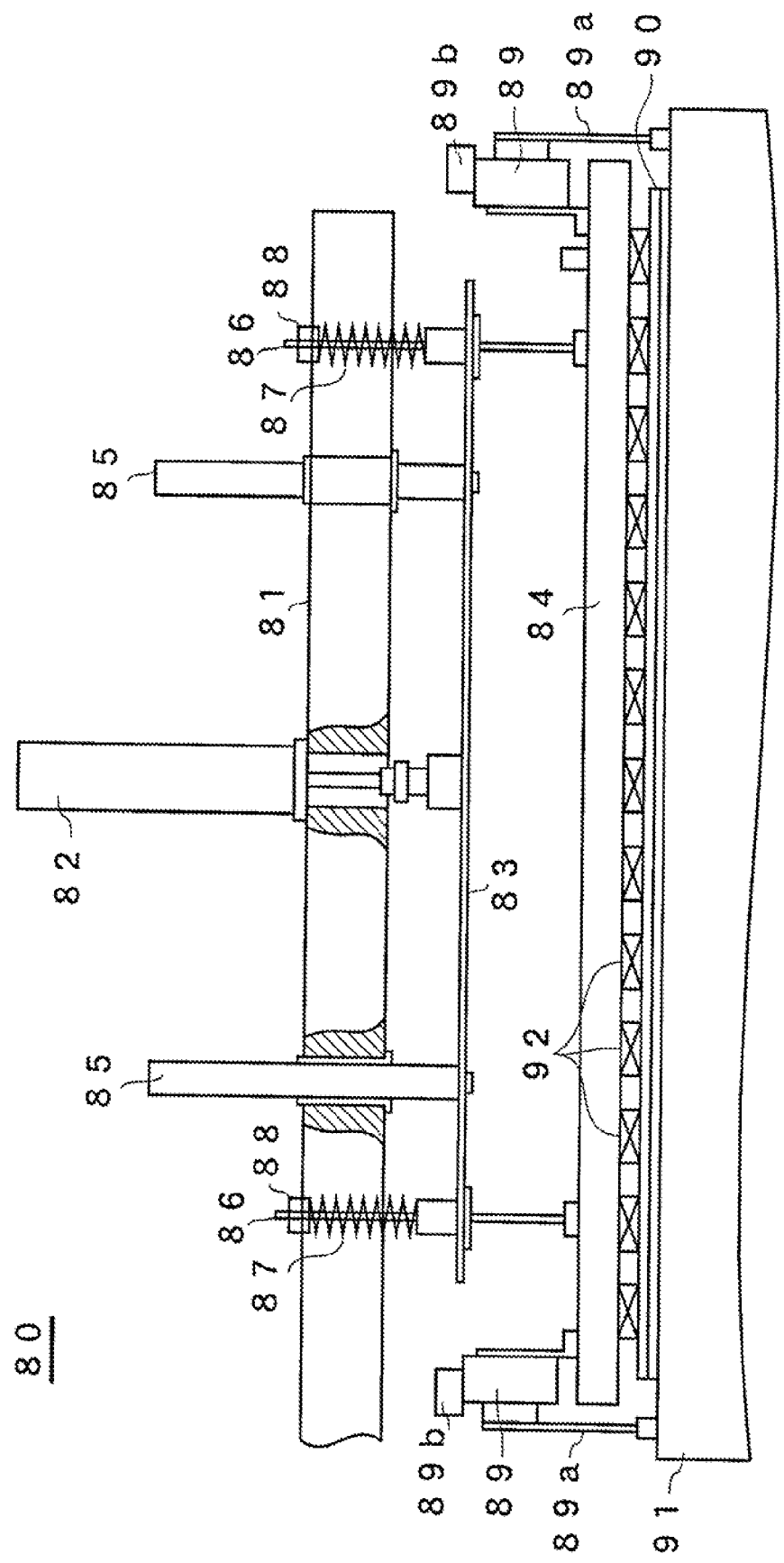
FIG. 4 is a cross-section view showing a configuration of a vacuum suction device of conventional example 4.

An example of attaching the suction pad 8 shown in FIG. 8 as the suction pad is illustrated in FIG. 5 to FIG. 7, however, the suction pad shown in FIG. 1 or FIG. 2 may be attached depending on the material, structure, or shape of the object to be sucked. For instance, the suction pad 51 of FIG. 1 may be used for a general substrate, or pressed article. Further, the suction pad 61 of FIG. 2 and the suction pad 8 of FIG. 8 are used to avoid changing the clearance between the two substrates in a case of laminated glass substrate or laminated plastic substrate such as the liquid crystal display panel substrate.

Figure 9:
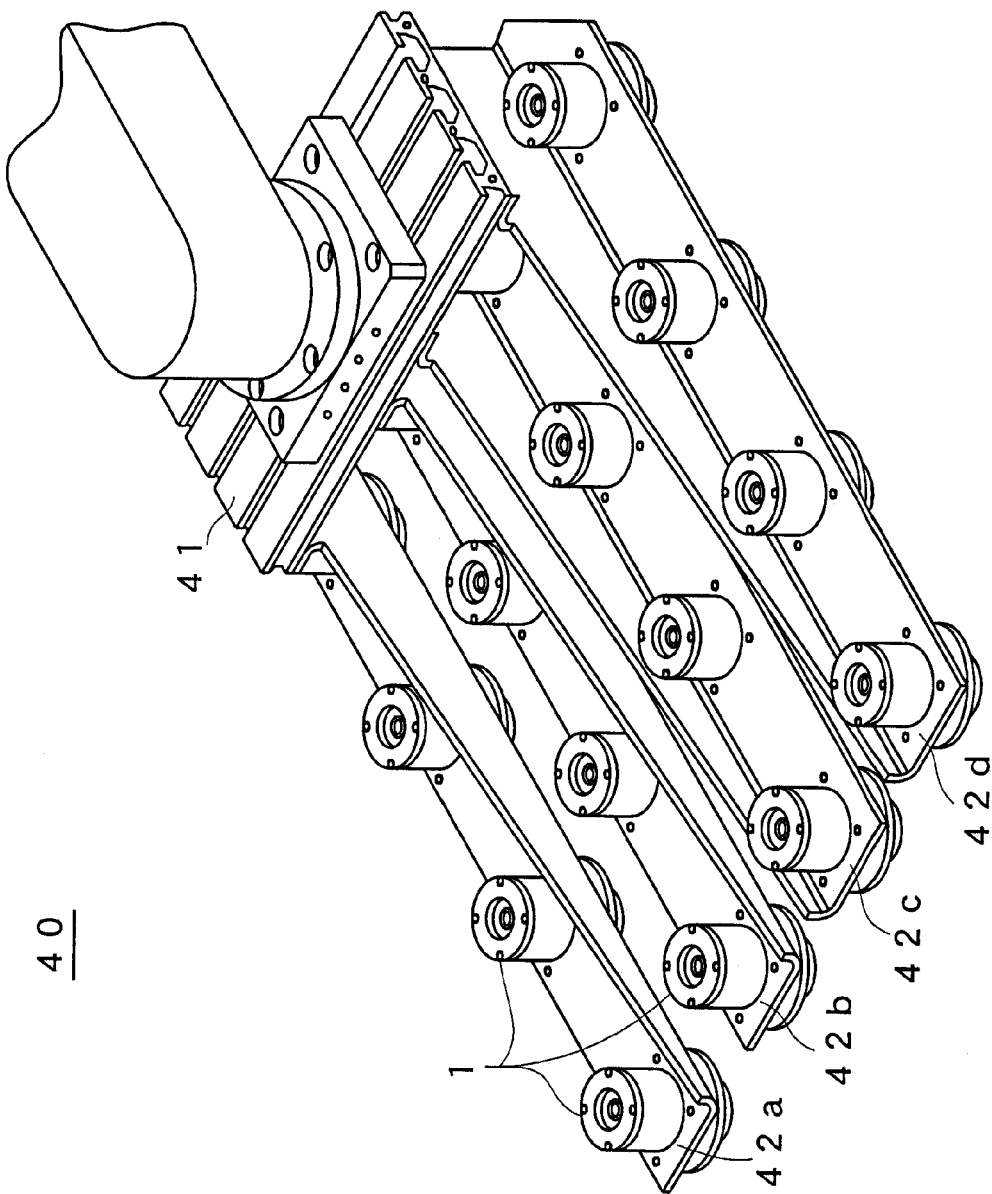
FIG. 9 is a schematic view of a vacuum suction device using the vacuum suction head of the embodiment.

The operation of sucking and conveying a large-sized object to be sucked using the vacuum suction head 1 configured as above will be explained. FIG. 9 shows one example of the vacuum suction device 40 provided with a plurality of vacuum suction heads 1. A plurality of angles 42*a*, 42*b*, 42*c*, 42*d* are fixed to a chucking table 41 according to the size of the object to be sucked. The plurality of vacuum suction heads 1 are attached in a line with respect to the respective angle 42 according to the size of the object to be sucked. Since the suction head 1 moves in a freely following manner even if undulation is present at the surface of the object to be sucked. It is not required to perform height adjustment of the suction head individually providing a mechanism for determining the height explained in conventional example 4. Thus, the attachment and adjustment task of the suction head is facilitated.

Figure 10:
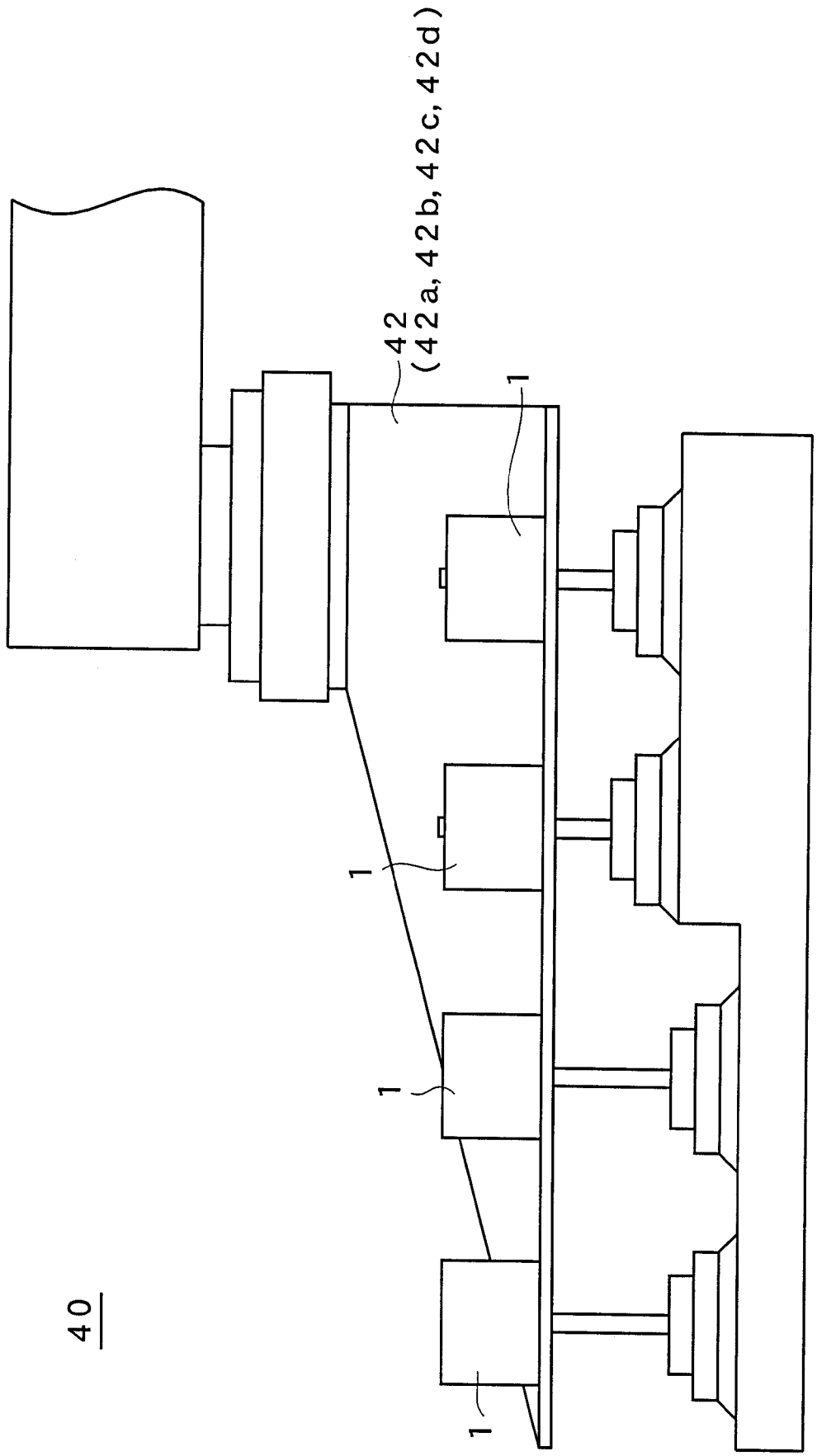
FIG. 10 is a view showing a frame format of sucking an object to be sucked with steps in the vacuum suction device of the present embodiment.

FIG. 10 shows one example of sucking the object to be sucked having a step with the vacuum suction device 40 provided with the plurality of vacuum suction heads 1. Even if the object to be sucked has a small step (offset) at the sucking surface, the object to be sucked is reliably sucked since the suction pad moves up and down in accordance with the surface shape of the object to be sucked and follows the surface of the object to be sucked. Only one vacuum suction head 1 may be arranged at the vacuum suction device 40 if the object to be sucked is small.

Figure 11:
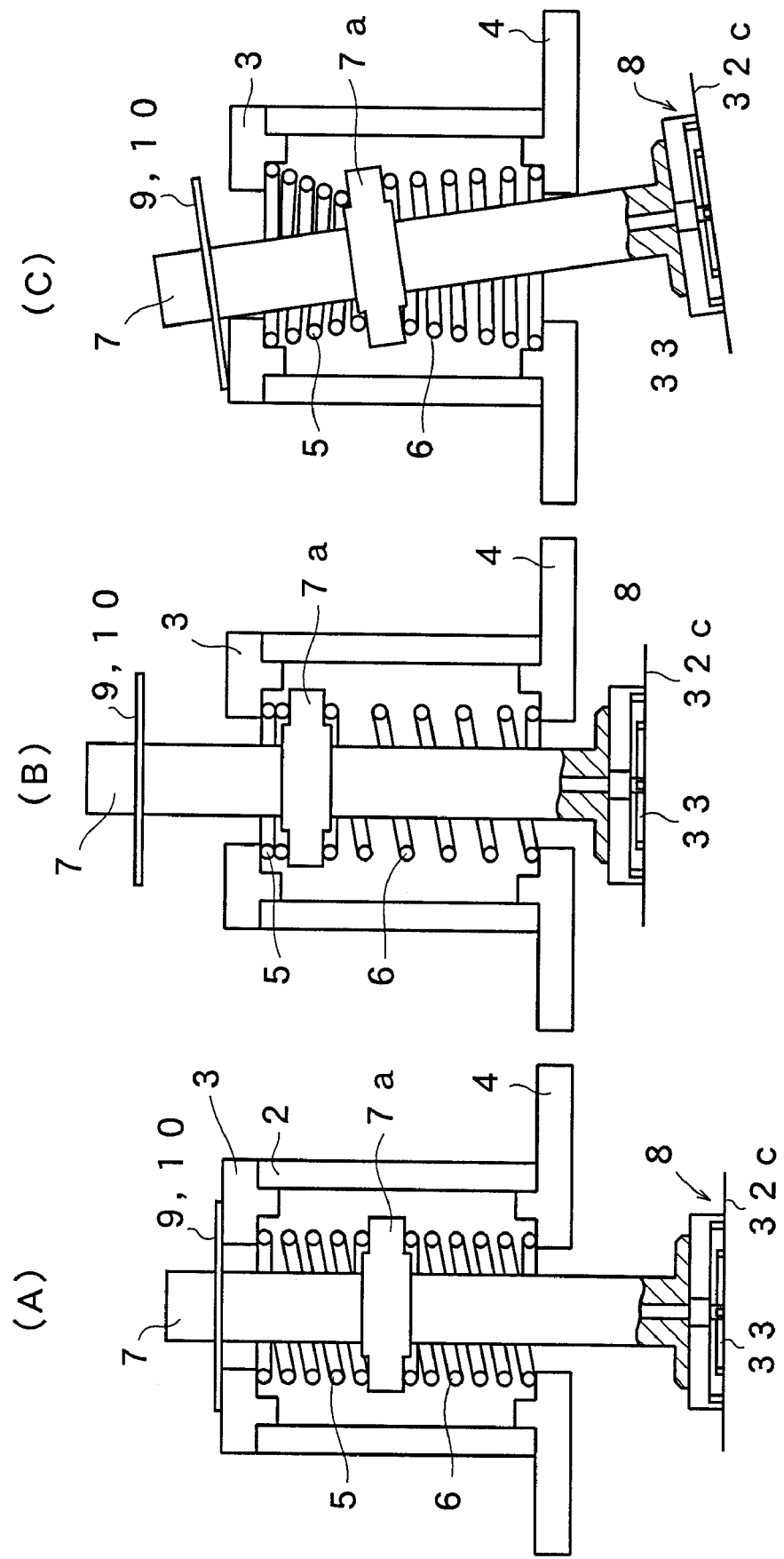
FIG. 11 is a view showing a frame format of showing change in orientation of the suction pad in the vacuum suction head of the embodiment.

When sucking and lifting a large-sized object to be sucked using the plurality of suction pads 8, undulation is formed at the large-sized object to be sucked. FIG. 11 shows a the change in the orientation of the suction pad 8. FIG. 11(A) is a cross-section view showing a state of the vacuum suction head 1 before suction. The figure shows a state in which the suction pad 8 is lowered to the lowermost end by the elastic force of the first spring 5 as explained above. In this state, the height of the suction pads 8 in all the vacuum suction heads 1 shown in FIG. 9 is aligned in the z-axis direction and the tilt of the suction pad 8 is also substantially aligned due to the property of the spring.

When all the vacuum suction heads 1 approach the object to be sucked mounted on a working table which is not shown, each suction pad 8 firmly attaches to the object to be sucked. When the lowering amount of the vacuum suction head 1 is large, each suction pad 8 largely moves backward in the "−" z-axis direction as shown in FIG. 11(B). When large undulation is present at the object to be sucked or the surface of the object to be sucked is slightly tilted, the shaft 7 moving in a freely following manner handles the object, and each suction pad maintains the desired suction force.

A case of pulling up the object to be sucked from the working table, and conveying it to another location will be considered. When sucking and conveying the large-sized object to be sucked, the object to be sucked sometimes bends depending on its own weight in the middle of the process. In particular, when the large-sized object to be sucked is held mainly at the central part by the suction pads, the outer peripheral part of the object to be sucked easily bends downward. In this case, the vertical line of the surface of the object to be sucked at the outer periphery portion deviates from the center axial direction of the vacuum suction head 1.

A case of using the suction pad 61 that does not have the oscillating function as shown in FIG. 2 will be considered. In this case, when the surface of one part of the object to be sucked is tilted after the suction disk 62 firmly attaches the surface of the object to be sucked, the parallelism of the suction disk 62 and the surface of the object to be sucked falls, and vacuum cannot be maintained at the suction disk 62. However, if the vacuum suction head 1 in the embodiment is used, the suction disk 62 arranged at the outer peripheral part of the object to be sucked can freely follow the tilt of the surface of the object to be sucked since the suction disk 62 freely follows. Thus, the suction force of the suction disk 62 is maintained.

The vacuum suction head in the embodiment does not remain in the tilted state as in the suction pad of conventional example 3 before sucking the object to be sucked, and after completing the suction and releasing the object to be sucked. The restoring force of the spring inside the suction head lets the orientation of the suction pad recover to the state in which the sucking surface is substantially facing directly below by. Thus, the object to be sucked is not damaged, or suction failure does not occur when sucking the object to be sucked.

If only the suction pad 8 as shown in FIG. 8 is used, the skirt part 32c sometimes does not contribute to the suction force when the suction disk 33 firmly attaches to the surface of the object to be sucked. If the surface of one part of the object to be sucked tilts in this state, the parallelism between the suction disk 33 and the surface of the object to be sucked falls, and the vacuum is not maintained at the suction disk 33. However, if the vacuum suction head 1 of the embodiment is used, the shaft 7 supported by the first spring 5 and the second spring 6 easily follows the tilt of the surface of the object to be sucked even if the surface of the object to be sucked is partially tilted. Thus, the object to be sucked can be steadily held. FIG. 11(C) shows such state. That is, the suction disk 33 itself follows the flexure of the object to be sucked to tilt.

The allowable tilt angle of the shaft 7 is determined by the outer diameter of the shaft 7 and the inner diameter of the first casing plate 3 and the second casing plate 4. The tilt elastic force of the shaft 7 is smaller than the extension or compression force of the shaft 7 in the axial direction. This means that the suction pad 8 can flexibly respond to the tilt of the sucking surface. The vacuum suction head 1 of the embodiment does not remain in the tilted state after completing suction and releasing the object to be sucked, as in the suction pad of conventional example 3, and the spring force inside the suction head lets the orientation of the suction pad recover to the state in which the sucking surface faces substantially directly below. Thus, the object to be sucked is not damaged and suction failure does not occur when sucking the object to be sucked.

The vacuum suction head 1 of the embodiment has the shaft 7 movable in the axial direction and capable of oscillating, and recovers the orientation of the suction pad to a state directing to a predetermined direction from the oscillated state by the spring force of the first spring 5 and the second spring 6 inside the suction head. Thus, the suction pad, which is not suitable for use in the conventional vacuum suction device, can also be used according to the property of the object to be sucked. In particular, the suction pad 61 shown in FIG. 2 is suitably used.

As described above, the vacuum suction head 1 of the embodiment has a feature of having the shaft 7 held by two springs. When the suction pad 8 is in the no-load state, the shaft 7 needs to be held at a predetermined position in the casing 2. A case in which such function is realized by the first spring 5, the second spring 6, and one spring will now be assumed. When the suction pad 8 is in the no-load state, one end of both ends of the one spring may be fixed inside the casing 2, and the other end may be fixed to the outer peripheral part of the shaft 7 in order to hold the shaft 7 at the predetermined position. Welding or pressing, after bending an end of the screw, the end into the inside of the casing 2 or the outer peripheral part of the shaft 7. According to the embodiment, the shaft 7 can be held at the predetermined position by simply inserting two springs without fixing the ends of the spring. The initial position of the shaft 7 with respect to the casing 2 can be freely set by changing the spring constant on the assumption that the step 7a is held between the two springs. In this regard, arranging two springs has great advantage in terms of number of assembly steps, and in terms of easily setting the initial position of the shaft 7.

Figure 12:
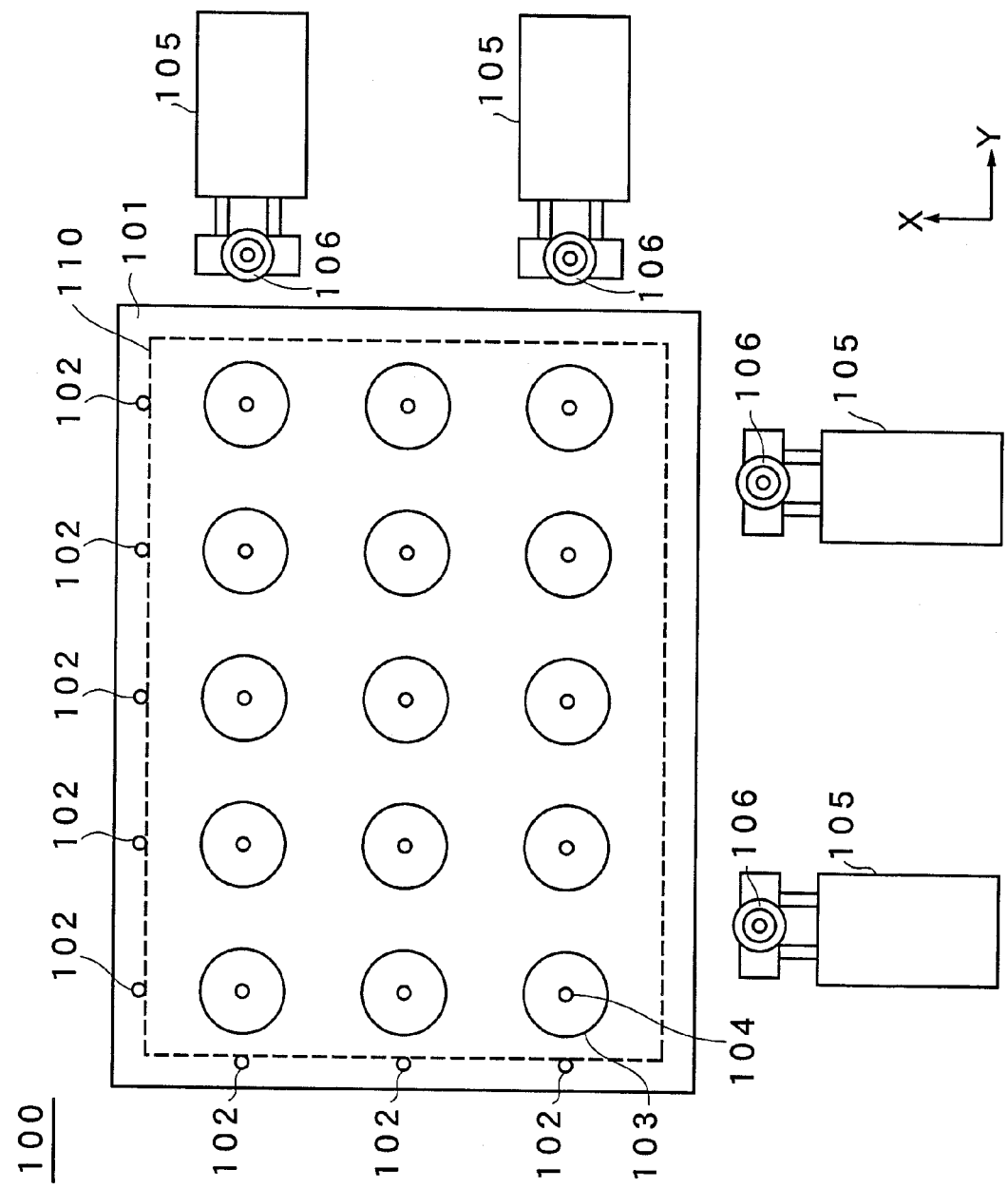
FIG. 12 is a top view showing a table using the vacuum suction head of the embodiment.
Figure 13:
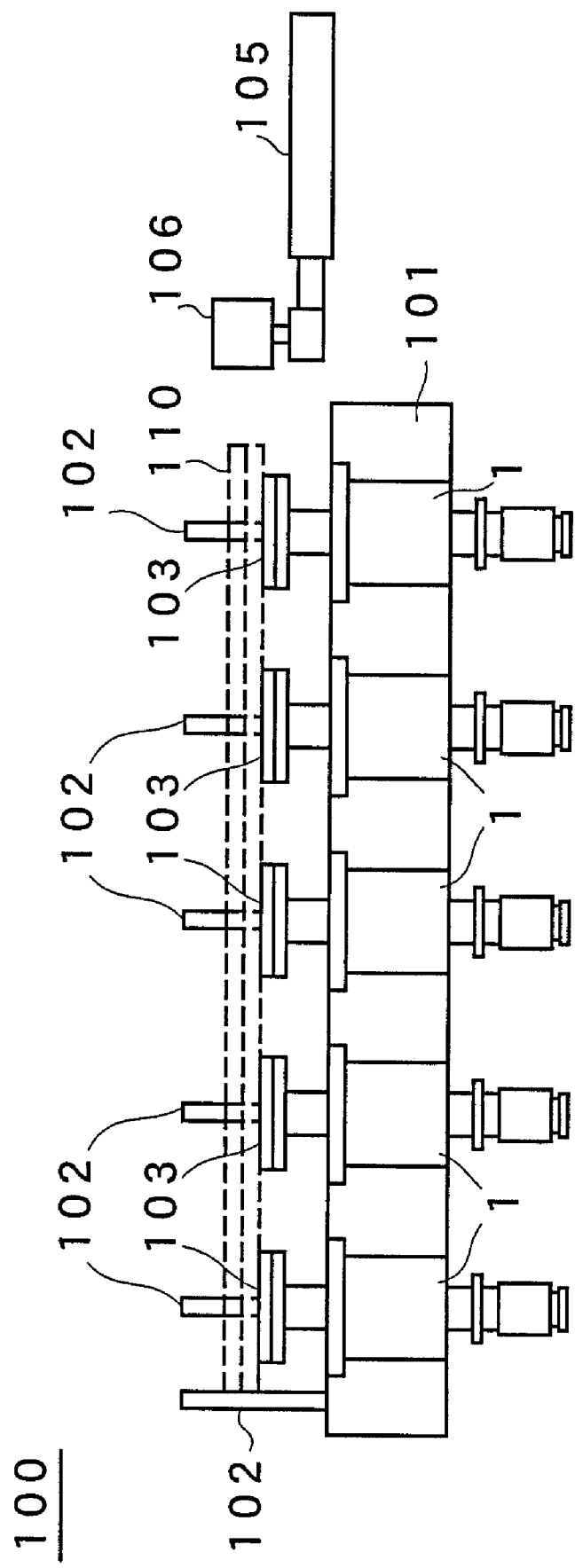
FIG. 13 is a side view showing the table using the vacuum suction head of the embodiment.

A table according to the embodiment of the present invention will be explained. This table has a plurality of suction heads arranged on the table with suction disks facing upward, and supports under surface of an object to be sucked. The object to be sucked is, for example, a mother laminated substrate 110. FIG. 12 shows a front view of the table 100 and FIG. 13 shows its side view.

The table 100 has a plurality of vacuum suction heads 1 regularly arranged at a predetermined distance on a base plate 101 acting as the base with the suction disk facing upward. A disc-shaped suction pad 103 is attached to the sucking part of the vacuum suction head 1. The suction pad 103 provides an air discharging hole 104 passing through the central part in the up and down direction, but does not have asperity parts at the sucking surface. The suction pad 103 is made of resin material and, for example, PEEK (registered trademark) material as an engineering plastic is used. The air discharging hole 104 is connected to the pump, not shown, by which appropriately discharging or vacuuming air can be performed.

A plurality of reference pins 102 are attached so as to be perpendicular to the base plate 101 and lined in one row at a predetermined distance along one end face in the x direction or y direction of the base plate 101. When positioning the mother laminated substrate 110 mounted on the suction pad 103, the mother laminated substrate 110 needs to contact the reference pin 102. A plurality of pushers 105 to achieve this purpose is provided. A roller 106 that contacts the mother laminated substrate 110 at its end face is attached to a distal end of the pusher 105. As the reference pin 102, similar one to the roller 106, may be provided.

A positioning operation of the substrate using the table 100 will be explained using FIG. 14. When the mother laminated substrate 110 is mounted on the table 100 by a conveying robot, the air blows from the air discharging hole 104 at the center of each suction pad 103, and the mother laminated substrate 110 is floated by the blowing air. The floated mother laminated substrate 110 is positioned by contacting the reference pin 102 in the x and y directions by the pusher 105. When positioning is completed, the air blowing is stopped, and the mother laminated substrate 110 is lowered and mounted on the suction pad 103. When the mother laminated substrate 110 is mounted on the suction pad 103, vacuuming is performed by a vacuum pump which is not shown through the air discharging hole 104, and held at the suction pad 103. When the mother laminated substrate 110 is sucked and held by the suction pad 103, the roller 106 returns to former state.

Figure 14:
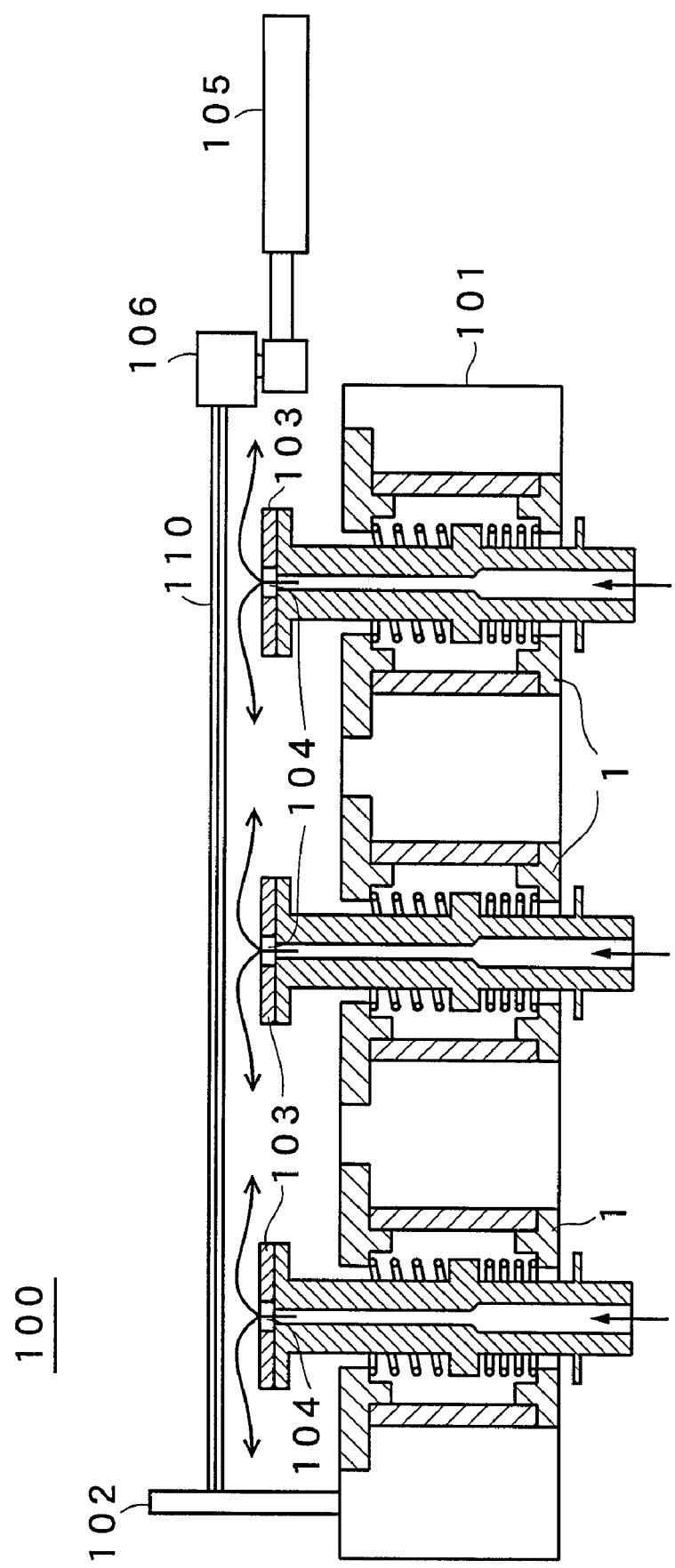
FIG. 14 is an explanatory view explaining a positioning operation in the table of the embodiment.

The air blowing from the suction pad 103 during the positioning operation flows along the surface of the mother laminated substrate 110 as shown with an arrow in FIG. 14. Since the surface of the suction pad 103 is a flat pad without asperity, the turbulent components are reduced and the flow of air stabilizes. Thus, the mother laminated substrate 110 stably floats without vibrating.

Figure 15:
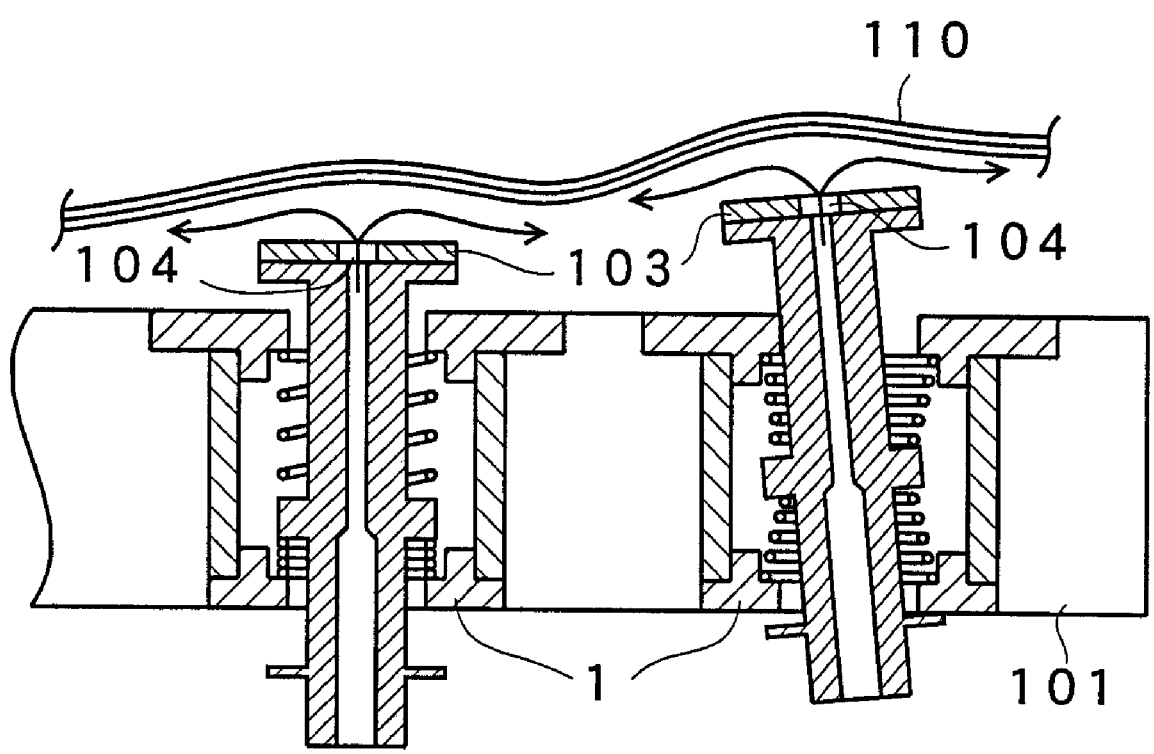
FIG. 15 is a view showing a frame format of the object to be sucked in a floating state in the table of the present embodiment.

FIG. 15 shows a frame format view with the flexure of the substrate exaggerated to show the irregular state of floating the substrate serving as an object to be sucked in the table of the embodiment. Conventionally, a clearance between the mother laminated substrate 110 and the table is taken by air blowing to float the mother laminated substrate 110 in positioning the substrate. Since the mother laminated substrate 110 floats by air blowing, flexure or undulation is formed at the mother laminated substrate 110. In this case, the substrate on the lower surface side of the mother laminated substrate 110 partially contacts the table, and the surface of the substrate on the lower surface side is sometimes scratched. When the mother laminated substrate 110 contacts the table during the positioning operation, a slight positioning shift occurs. Thus, high precision positioning (alignment) cannot be performed on the substrate.

The vacuum suction head 1 of the present invention is elastically supported so that the shaft 7 is slightly movable in the z-axis direction and in the direction diagonal from the z-axis direction. The suction pad 103 thus completely follows the flexure or undulation of the mother laminated substrate 110 within the tilt allowable range of the shaft 7 due to Bernoulli's effect by air blowing in the table 100 using the vacuum suction head 1, as shown in FIG. 15. The suction pad 103 moves up and down to maintain the clearance between the mother laminated substrate 110 and the suction pad 103 constant in positioning the substrate, and the substrate 110 moves to a predetermined position. The air blowing from the air discharged hole 104 becomes a layered flow to the outer periphery of the suction pad 103, and the clearance between the mother laminated substrate 110 and the suction pad 103 is maintained constant. Thus, damage to the back surface of the mother laminated substrate 110 is prevented, and a stable floating state is maintained.

Since positioning is performed in such stable state, the mother laminated substrate 110 is stably positioned at high precision without shifting. When the positioned mother laminated substrate 110 is mounted on the suction pad 103, the vacuum suction head 1 freely follows the tilt of the surface of the mother laminated substrate 110 according to the pressure difference caused by the above-mentioned Bernoulli's effect since the vacuum suction head 1 can follow in a free manner. Thus, an unnecessary stress is not applied to the mounted mother laminated substrate 110. The suction pad 103 reliably sucks and holds the mother laminated substrate 110 even in the subsequent vacuuming by the vacuum pump.

In the table 100 using the vacuum suction head of the embodiment, when the mother laminated substrate 110 is mounted before positioning or mounted again after positioning, the sucking surface of the vacuum suction head can be recovered to the state facing substantially directly above even before suction of the mother laminated substrate 110 or even after release of the mother laminated substrate 110 after suction. Thus, the advantages of not damaging the mother laminated substrate 110 and not causing suction failure are obtained when mounting the mother laminated substrate 110 next.

The table 100 needs to provide at least one vacuum suction head 1 according to the size of the substrate. When providing a plurality of vacuum suction heads, the vacuum suction heads 1 are preferably arranged in mesh or lattice, as shown in FIG. 12. Further, the arrangement density may be high at outer peripheral part of the substrate and low at other parts. A positioning device further providing the positioning means on the above-described table is very effectively applied as a pre-alignment device prior to conveying the substrate in the manufacturing step of the flat panel display and the manufacturing step of the semiconductor device.

The vacuum suction head 1, vacuum suction device 40, and table 100 are used even when the atmosphere gas is not only air but inactive gas such as nitrogen gas or reactive gas. Therefore, gas whose components are corresponding to the purpose is selectively used for the gas blowing from the air discharging hole at the center of the suction pad 103 when mounting the mother laminated substrate 110 on the table by the conveying robot, as shown in FIG. 14 and FIG. 15.

Further, the vacuum suction head 1, vacuum suction device 40, and table 100 are explained in an example in which the object to be sucked is arranged horizontally, but is not limited to such state, and even if the object to be sucked is standing or tilted, the advantages of the present invention can be obtained by optimizing the supporting and conveying mechanism of the object to be sucked.

The object to be sucked applied with the vacuum suction head 1, vacuum suction device 40, and table 100 of the present invention includes a plate-shaped molded article made of resin, and thin plate made of metal. It further includes a brittle material substrate such as glass plate, ceramics of sintered material, monocrystal silicon, sapphire, semiconductor wafer, ceramic substrate and the like. The brittle material substrate includes a single plate or laminated substrate, and includes a substrate attached with a metal film or resin film for forming a circuit pattern or electrode.

A specific application of the brittle material substrate includes a flat panel display panel such as a liquid crystal display panel, plasma display panel, organic EL display panel and the like.

INDUSTRIAL APPLICABILITY

The vacuum suction head of the present invention is not only used in sucking and conveying an object to be sucked, for example, a flat panel display such as a glass plate, liquid crystal display panel using the glass substrate, and liquid crystal display panel using the plastic substrate, and may be used in a field of conveying a semiconductor, ceramic plate, plate-shaped molded article made of resin, thin plate made of metal and the like. The height adjustment work of a suction pad is easily performed, and in particular, plate material having undulation, steel plate or pressed plate having steps on the surface can also be sucked. Further, the object to be sucked is reliably floated, positioned and sucked by blowing compressed air through a vent hole by arranging at least one vacuum suction head of the present invention with the suction disk facing upward to configure the vacuum suction table.

The invention claimed is:

1. A vacuum suction head comprising:
a suction pad which contacts a sucking surface of an object to be sucked and sucks the object with vacuum contact;
a shaft which holds said suction pad at one end, and comprises an air charging and discharging hole for charging gas into and discharging gas from said suction pad;
a casing part which has a cylindrical space for regulating a movable range of said shaft and holding said shaft in a slightly movable manner; and
an elastic supporter which elastically supports said shaft in said casing part, in a freely and slightly movable manner in an axial direction of said casing part and in a direction diagonal to the axial direction, said shaft comprising a step having a flange shape at a substantially intermediate position in said casing part, said casing part comprising a cylindrical part which provides a space for holding said elastic supporter in a freely deforming manner in an inner side, a first casing plate which has a first opening and encloses one end of said cylindrical part, and a second casing plate which has a second opening and encloses another end of said cylindrical part, said elastic supporter comprising a first spring which is held between said first casing plate and said step, and a second spring which is held between said second casing plate and said step.

2. The vacuum suction head according to claim 1, wherein:
said first spring and said second spring are coil springs; and
an aperture-diameter of said first and second openings is larger than an outer diameter of said shaft and smaller than an outer diameter of said first spring and said second spring.

3. The vacuum suction head according to claim 1, wherein:
said suction pad is arranged closer to said second opening than said first opening; and
a compression force of said first spring is greater than a compression force of said second spring when said suction pad is in a no-load state.

4. The vacuum suction head according to claim 1, wherein said suction pad comprises a sucking part which uses a plate-shaped member and has a plurality of independent convex parts and concave parts on one surface of the member, an air tight part which is formed into an annular shape at an outer peripheral position of said plate-shaped member surrounding said sucking part, a groove which acts as a passage for discharging gas of said sucking part, and a vacuum suction disk which has an opening for externally discharging gas in said groove.

5. The vacuum suction head according to claim 4, wherein said suction pad provides a skirt pad which is formed so as to surround said vacuum suction disk, and shields outside air from surrounding space of said vacuum suction disk when said vacuum suction disk approaches the object to be sucked up to a predetermined position.

6. The vacuum suction head according to claim 1, wherein said suction pad is composed of a flat resin without asperity.

7. A vacuum suction device comprising:
a plurality of vacuum suction heads, each vacuum suction head comprising:
a suction pad which contacts a sucking surface of an object to be sucked and sucks the object with vacuum contact;
a shaft which holds said suction pad at one end, and comprises an air charging and discharging hole for charging gas into and discharging gas from said suction pad;
a casing part which has a cylindrical space for regulating a movable range of said shaft and holding said shaft in a slightly movable manner; and
an elastic supporter which elastically supports said shaft in said casing part, in a freely and slightly movable manner in an axial direction of said casing part and in a direction diagonal to the axial direction, wherein said plurality of vacuum suction heads contact the surface of the object to be sucked and suck with vacuum contact, said shaft comprising a step having a flange shape at a substantially intermediate position in said casing part, said casing part comprising a cylindrical part which provides a space for holding said elastic supporter in a freely deforming manner in an inner side, a first casing plate which has a first opening and encloses one end of said cylindrical part, and a second casing plate which has a second opening and encloses another end of said cylindrical part, said elastic supporter comprising a first spring which is held between said first casing plate and said step, and a second spring which is held between said second casing plate and said step.

8. A table comprising:
a plurality of vacuum suction heads, each vacuum suction head comprising:
a suction pad which contacts a sucking surface of an object to be sucked and sucks the object with vacuum contact;
a shaft which holds said suction pad at one end, and comprises an air charging and discharging hole for charging gas into and discharging gas from said suction pad;
a casing part which has a cylindrical space for regulating a movable range of said shaft and holding said shaft in a slightly movable manner; and
an elastic supporter which elastically supports said shaft in said casing part, in a freely and slightly movable manner in an axial direction of said casing part and in a direction diagonal to the axial direction, said vacuum suction heads being arranged on a base plate with said suction pads facing upward, wherein gas is blown from said suction pad to float the object to be sucked mounted on said suction pad, and gas is discharged from said suction pad to contact and suck the sucking surface of the object to said suction pad via vacuum contact, said shaft comprising a step having a flange shape at a substantially intermediate position in said casing part, said casing part comprising a cylindrical part which provides a space for holding said elastic supporter in a freely deforming manner in an inner side, a first casing plate which has a first opening and encloses one end of said cylindrical part, and a second casing plate which has a second opening and encloses another end of said cylindrical part, said elastic supporter comprising a first spring which is held between said first casing plate and said step, and a second spring which is held between said second casing plate and said step.

9. The table according to claim 8, further comprising positioning means for positioning said object to be sucked.

* * * * *